United States Patent [19]

Takasaki

[11] Patent Number: 5,183,778
[45] Date of Patent: Feb. 2, 1993

[54] METHOD OF PRODUCING A SEMICONDUCTOR DEVICE

[75] Inventor: Kanetake Takasaki, Tokyo, Japan

[73] Assignee: Fujitsu Limited, Kawasaki, Japan

[21] Appl. No.: 814,157

[22] Filed: Dec. 30, 1991

Related U.S. Application Data

[62] Division of Ser. No. 615,970, Nov. 20, 1990, Pat. No. 5,107,317.

[30] Foreign Application Priority Data

Nov. 20, 1989 [JP] Japan ................................. 1-299758

[51] Int. Cl.$^5$ ............... H01L 21/20; H01L 21/203; H01L 21/205
[52] U.S. Cl. ................................. 437/132; 148/33.4; 148/33.5; 148/DIG. 59; 437/107
[58] Field of Search ............ 148/DIG. 59, DIG. 65, 148/33.4, 33.5; 437/126, 132, 105, 106, 107; 357/30 E, 30 P, 16, 22 A, 22 MD, 22 J, 30 B, 17; 372/43

[56] References Cited

U.S. PATENT DOCUMENTS

| | | | |
|---|---|---|---|
| 4,226,649 | 10/1980 | Davey et al. | 437/132 |
| 4,325,181 | 4/1982 | Yoder | 437/132 |
| 4,400,221 | 8/1983 | Rahilly | 357/30 E |
| 4,716,445 | 12/1987 | Sone | 357/16 |
| 4,891,329 | 1/1990 | Reisman et al. | 437/61 |
| 4,897,367 | 1/1990 | Ogasawara | 437/132 |
| 5,047,365 | 9/1991 | Kawanaka et al. | 437/132 |
| 5,091,333 | 2/1992 | Fan et al. | 437/132 |

FOREIGN PATENT DOCUMENTS

| | | | |
|---|---|---|---|
| 0288681 | 11/1988 | European Pat. Off. | |
| 0326832 | 8/1989 | European Pat. Off. | |
| 0334682 | 9/1989 | European Pat. Off. | 437/132 |
| 54-21294 | 2/1979 | Japan . | |
| 55-118627 | 9/1980 | Japan . | |
| 61-189621 | 8/1986 | Japan . | |
| 63-184320 | 7/1988 | Japan | 148/33.4 |
| 2-101736 | 4/1990 | Japan | 437/132 |
| 2-150032 | 6/1990 | Japan | 437/132 |

OTHER PUBLICATIONS

Fischer et al., "GaAs Bipolar Transistors Grown on (100) Si Substrates by Molecular Beam Epitaxy", Appl. Phys. Lett., vol. 47, No. 4, Aug. 15, 1985, pp. 397–399.
Dumke et al., "Heterostructure Long Lifetime Hot Electron Transistor", IBM Technical Disclosure Bulletin, vol. 24, No. 7A, Dec. 1981, pp. 3229–3231.
Sheldon et al., "Growth and Patterning of GaAs/Ge Single Crystal Layers on Si Substrates by Molecular Beam Epitaxy", Appl. Phys. Lett., vol. 45, No. 3, Aug. 1, 1984, pp. 274–276.

*Primary Examiner*—Mary Wilczewski
*Attorney, Agent, or Firm*—Staas & Halsey

[57] ABSTRACT

A semiconductor device is produced by forming a crystalline substrate of a first layer of Si and a second layer of GaAs or GaAs-containing compound formed on the first layer, wherein a Ge or Ge-containing crystalline layer is formed as an intervening layer between the second layer and the first layer.

5 Claims, 3 Drawing Sheets

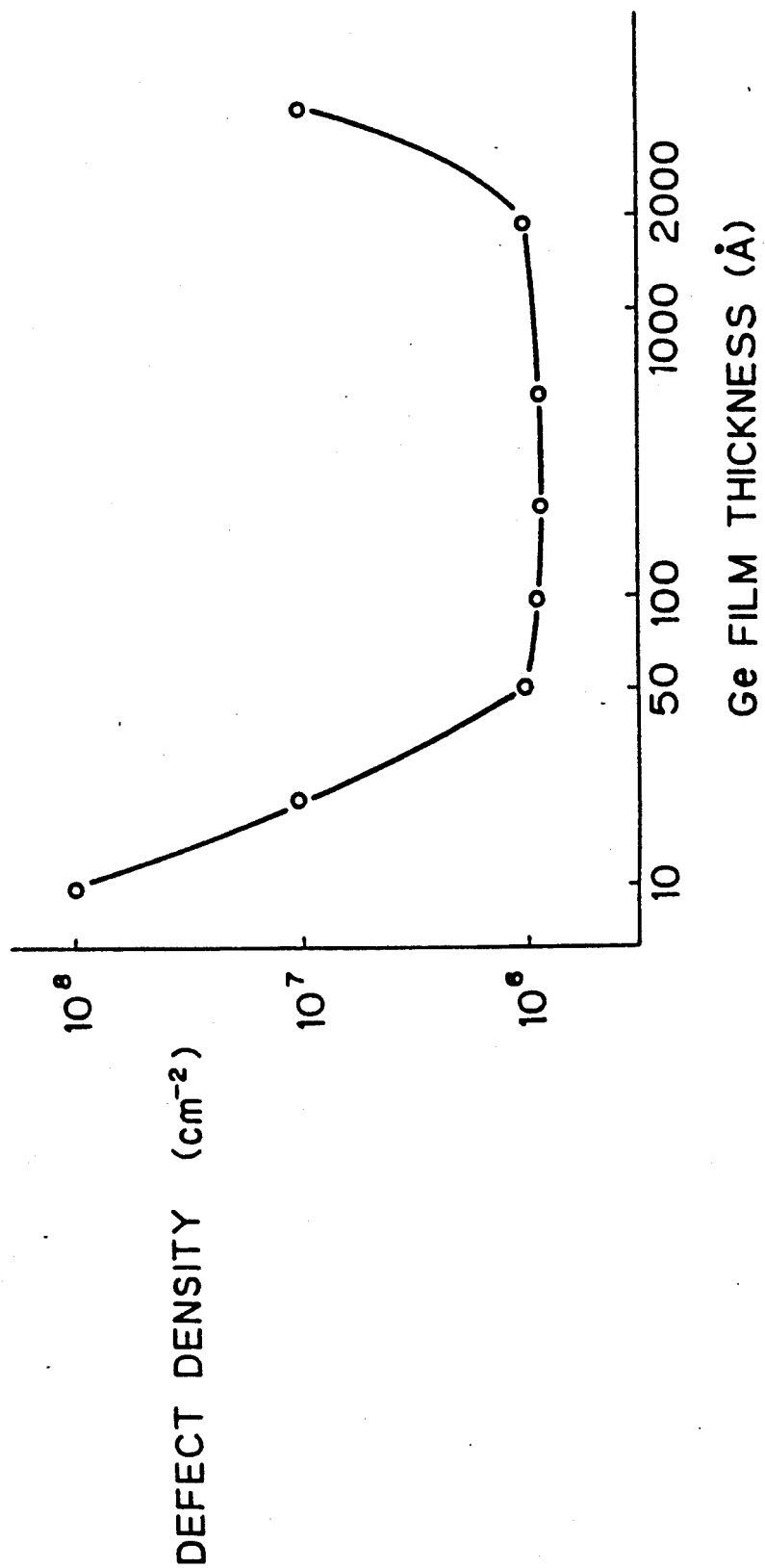

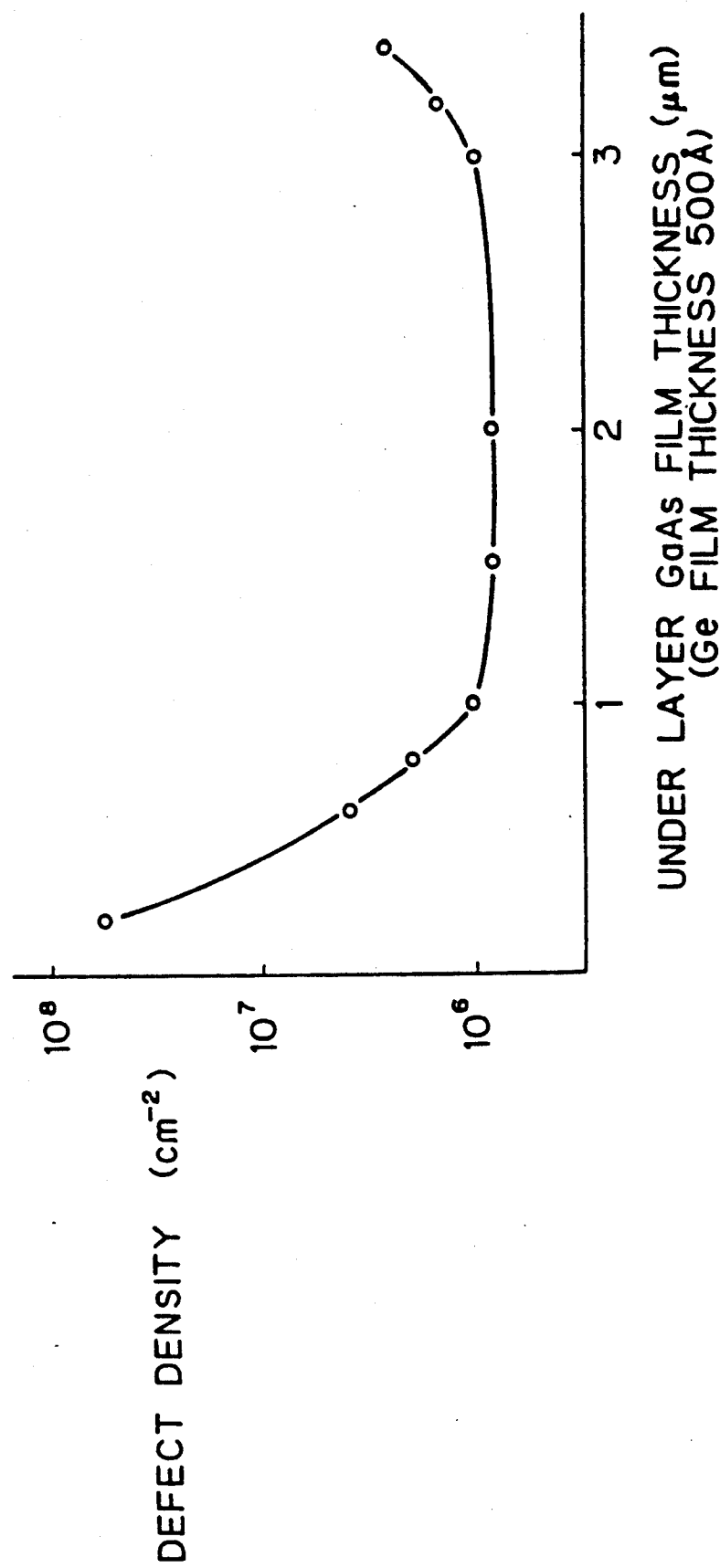

METHOD OF PRODUCING A SEMICONDUCTOR DEVICE

This application is a division of application Ser. No. 07/615,970, filed Nov. 20, 1990, now U.S. Pat. No. 5,107,317.

BACKGROUND OF THE INVENTION

1. Field of the Invention

This invention relates to a semiconductor device and a method of producing the semiconductor device and more particularly, relates to a semiconductor device having a gallium arsenide (GaAs) crystalline thin film on a silicon (Si) substrate, and a method of producing the same.

GaAs is used to obtain a higher speed operation than obtainable with Si, and has a light emission function enabling it to be used for a LED or Laser etc. Nevertheless, it is not easy to obtain a large diameter wafer of GaAs, and the mechanical strength thereof is low, and thus in practice inpractice GaAs is not used as much as Si.

In view of the above, attempts have been made to form a GaAs substrate on a Si substrate having a large diameter, which can be easily obtained and has a superior mechanical strength, and to form a device on the surface of the GaAs substrate.

2. Description of the Related Art

As shown in FIG. 1, when a GaAs crystalline layer 2 is formed directly on a Si substrate 1 a number of defects such as strain and dislocation, etc., occur due to the difference of the lattice constants thereof or the thermal expansion coefficients at the interface between the GaAs crystalline layer 2 and the Si substrate 1, and those defects are propagated to the upper layer as denoted by lines 5. Thus a device having good electrical properties cannot be obtained. Namely, when for example a MESFET or a HEMT, etc. is formed, the threshold voltage is varied. Therefore, a method of directly reducing the crystal defects of about $10^7$ to about $10^8/cm^2$ existing in the GaAs crystalline layer also has been considered.

To reduce the crystal defects, for example, after a GaAs crystalline layer is grown on a Si substrate, a thermal cycle annealing has been carried out in which, for example, a heat treatment at a temperature of 200° C. for 10 min., and subsequently, at a temperature of 800° C. for 10 min. is repeated. Also, to reduce the crystal defects, a half-thick GaAs layer for a desired thick GaAs layer is first grown, and subsequently, the above-mentioned thermal cycle annealing is effected and then a GaAs layer is formed as the remaining half-thick layer.

Nevertheless, in the above-mentioned GaAs crystal defect reduction process using the thermal cycle annealing, it is difficult to lower the crystal defect density to approximately a $1 \times 10^6/cm^2$ level, at which there is influence on the electrical properties of an element.

Further, as a method of forming a GaAs layer on a Si substrate, it is well known that a buffer layer of Ge having a lattice constant close to that of GaAs can be formed on the Si substrate, and a GaAs layer can be formed on the buffer layer. When the buffer layer of Ge is formed on a Si substrate, a dislocation is often generated at the Si/Ge interface, due to approximately a four percent difference of the lattice constants of the Si and Ge and thus it is difficult to lower the crystal defect density of GaAs to $1 \times 10^8/cm^2$ or less.

SUMMARY OF THE INVENTION

An object of the present invention is to provide a semiconductor device having a GaAs crystal formed on a Si substrate, in which crystal the defect density is lowered to $1 \times 10^6/cm^2$ or less.

Another object of the present invention is to provide a method of producing the semiconductor device.

Therefore, according to the present invention, there is provided a semiconductor device which has comprising a crystalline with a Sisurface substrate a first layer of GaAs or a GaAs-containing compound formed on and a second buffer layer of Ge or Ge-containing crystalline layer formed as an intervening layer between the first buffer layer and a GaAs compound semiconductor layer.

Therefore, in the present invention, a germanium (Ge) or Ge-containing layer is intervened between a gallium arsenide (GaAs) or GaAs-containing compound and a silicon (Si) substrate.

When, for example, a Ge single crystalline layer is intervened between a GaAs layer and a Si substrate, since GaAs has a different crystal structure from that of Ge, i.e., GaAs has a zinc blend structure and Ge has a diamond structure, the crystalline defects such as dislocation, etc., propagated from the under or lower layer are not propagated upward but are directed horizontally. Namely, a blocking effect is generated, and thus defects are not generated in the upper surface of the Ge layer.

Since the lattice constants of GaAs and Ge are close to each other, i.e., the lattice constant of GaAs is about 5.653 Å and the lattice constant is about 5.658 Å, a difference of about 0.09%, new defects are rarely generated at the interface between GaAs and Ge.

In the present invention, preferably the Ge or Ge-containing crystalline layer has a thickness of 50 to 2000 Å, and the GaAs or GaAs-containing layer formed on or below the Ge or Ge containing crystalline layer has a thickness of 1 to 3 μm.

According to the present invention, AlGaAs, InGaAs, GaAsP or InGaAsP, etc., the lattice constants of which are substantially the same as that of Ge, can be advantageously used instead of GaAs. Further, SiGe, etc., also can be used instead of the Ge intervening layer.

According to the present invention, there is further provided a method of producing a semiconductor device, which includes the steps of:

preparing a Si layer;

forming a first crystalline layer of GaAs or GaAs-containing compound;

forming a Ge or Ge-containing crystalline layer on the first crystalline layer; and forming a second crystalline layer of GaAs or GaAs-containing compound on the Ge or Ge-containing crystalline layer.

According to the present invention, an amorphous Si layer is preferably formed on the Si layer before the first crystalline layer is formed.

Preferably products of the present invention are MESFET, a HEMT (High Electron Mobility Transistor), a photo-diode, and a Laser, etc.

BRIEF DESCRIPTION OF THE DRAWINGS

FIG. 3 is a view of a relationship between thickness of a Ge crystalline layer (Ge film thickness) and a defect density in an upper GaAs crystalline layer having a thickness of about 1.5 μm; and FIG. 4 is a view illustrating a relationship between a thickness of a lower GaAs layer (under layer GaAs film thickness) and a defect density in an upper GaAs layer when the Ge crystalline layer has a thickness of 500 Å.

PREFERRED EMBODIMENT OF THE INVENTION

An example of the present invention will now be explained with reference to the accompanying drawings.

Figure 1:
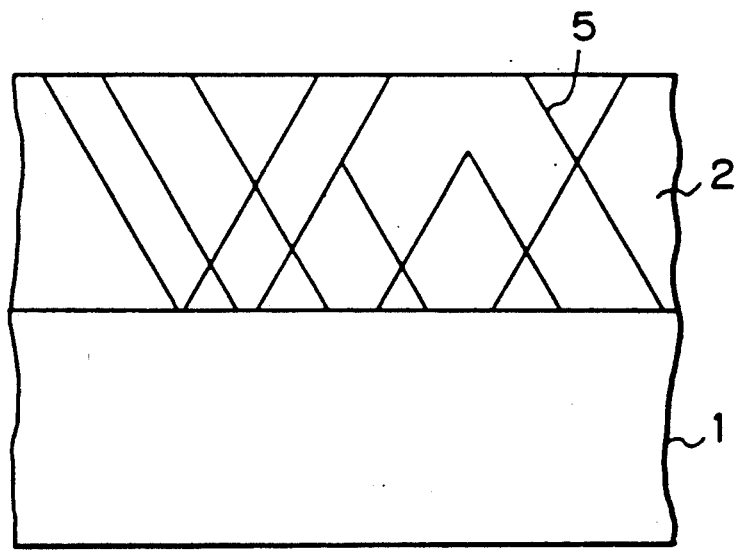
FIG. 1 is a schematic cross-sectional view for explaining the prior art.
Figure 2:
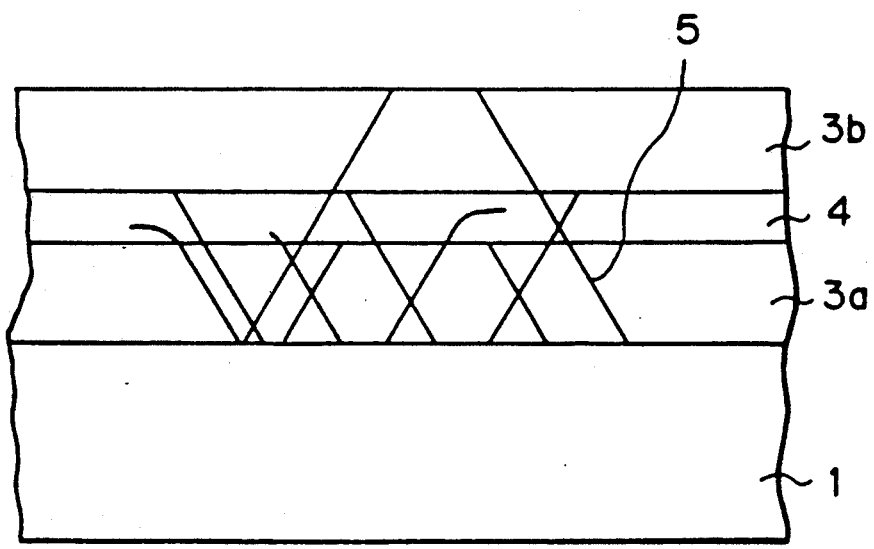
FIG. 2 is a schematic cross-sectional view illustrating one embodiment of the present invention.

FIG. 2 is a schematic cross-sectional view illustrating one example according to the present invention.

As shown in FIG. 2, on a (100) surface of a silicon (Si) substrate (wafer) 1 are provided a lower GaAs crystalline layer 3a having a thickness of about 1.5 μm, a Ge crystalline layer 4 having a thickness of about 1000 Å, and an upper GaAs crystalline layer 3b having a thickness of about 1.5 μm.

In FIG. 2, defects such as dislocation, etc., generated in the lower GaAs crystalline layer 3a are absorbed and reduced in the Ge crystalline layer 4, and only some of the defects are propagated to the upper GaAs crystalline layer 3b. As denoted by lines 5.

FIG. 3 is a view of a relationship between a thickness of a Ge crystalline layer (Ge film thickness) and a defect density in an upper GaAs crystalline layer having a thickness of about 1.5 μm.

FIG. 3 shows that the defect density of the upper GaAs crystalline layer is lowered to $1 \times 10^6/cm^2$ when the Ge film thickness is in a range of from 50 to 2000 Å.

Further, FIG. 4 is a view illustrating a relationship between a thickness of a lower GaAs layer (under layer GaAs film thickness) and a defect density in an upper GaAs layer when a Ge crystalline layer has a thickness of 500 Å.

FIG. 4 shows that the defect density is lowered to $1 \times 10^6/cm^2$ when the under layer GaAs film is in a range of from 1 to 3 μm.

Accordingly, a MESFET (not shown) having a Ge crystalline layer 4 acting as an n type substrate, an upper GaAs crystalline layer 3b acting as a p or i type substrate, and an n type electrical element can be produced.

Further, another MESFET (not shown) having a Ge crystalline layer 4 acting as a p type substrate using boron ion implantation) and an upper GaAs crystalline layer 3b acting as an n type substrate for an electrical element also can be obtained.

The production process of the crystalline layer shown in FIG. 2 of a semiconductor device will now be explained.

First, on a (100) surface of a Si substrate 1 is formed a lower GaAs crystalline layer 3a, to a thickness of about 1.5 μm, by an MOCVD (Metal Organic Chemical Vapor Deposition) process using trimethylgallium (TMG) and arsine ($AsH_3$) as reaction gases, at a growth temperature of 700° C., for a growth time of about 30 min., and under a growth pressure of about 76 Torr. Although a lower GaAs crystalline layer 3a can be directly formed on the Si substrate 1 an amorphous GaAs (a-GaAs) layer is preferably formed on the Si Substrate 1 before forming the lower GaAs crystalline layer 3a. Namely, the a-GaAs layer is grown to a thickness of about 200 Å at a temperature of 450° C.

The a-GaAs layer can be formed flat and thus an abnormal nucleus growth can be prevented, and further, strain can be reduced by forming the a-GaAs layer. The a-GaAs layer can be single crystallized at 700° C. in a later process. Then a Ge crystalline layer is formed to a thickness of about 1000 Å on the lower GaAs crystalline layer 3a by the same device using germane ($GeH_4$) and hydrogen ($H_2$) as reaction gases, at a growth temperature of about 400° C., for a growth time of 10 min., and under a growth pressure of about 76 Torr.

Thereafter, an upper GaAs crystalline layer 3b is again formed to a thickness of about 1.5 μm, by the same production process as explained above.

GaAs and Ge can also be grown by an MBE (Molecular Beam Epitaxial) growth process.

Then, after the GaAs (3b)/Ge (4)/GaAs(3a) crystalline layer is formed, an electrical element such as a MESFET, a MBMT, a photo-diode or a laser can be formed on the GaAs layer 3b.

In the present invention, the same effects can be obtained by using sapphire or MgO etc. whose crystal form is similar to that of Si.

I claim:

1. A method of producing a semiconductor device, comprising the steps of:
    preparing a Si layer (1);
    forming a first crystalline layer (3a) of GaAs or GaAs-containing compound on said Si layer (1);
    forming a Ge or Ge-containing crystalline layer (4) on said first crystalline layer (3a); and
    forming a second crystalline layer (3b) of GaAs or GaAs-containing compound on said Ge or Ge-containing crystalline layer (4).

2. A method according to claim 1, further comprising the step of forming an amorphous GaAs layer on said Si layer (1) before forming said first crystalline layer (3a).

3. A method according to claim 1, wherein said formed Ge or Ge-containing crystalline layer (4) has a thickness of 50 to 2000 Å.

4. A method according to claim 1, wherein said first crystalline layer (3a) formed on said Si layer (1) has a thickness of 1 to 3 μm.

5. A method according to claim 1, wherein said Ge or Ge-containing crystalline layer (4) is formed by an MOCVD or MBE process.

* * * * *

UNITED STATES PATENT AND TRADEMARK OFFICE
CERTIFICATE OF CORRECTION

PATENT NO. : 5,183,778
DATED : February 2, 1993
INVENTOR(S) : Kanetake TAKASAKI

It is certified that error appears in the above-identified patent and that said Letters Patent is hereby corrected as shown below:

Column 1, line 22, delete "inpractice";
         line 37, after "Thus" insert --,--;
         line 49, after "min." insert --,--; and
         line 60, before "influence" insert --no--.

Column 2, line 1, after "Ge" insert --,--; and
         lines 12 and 13, delete "comprising", change "with a Sisurface substrate" to --substrate with a Si surface--, and after "first" insert --buffer--.

Column 3, line 33, change "3b. As" to --3b as--; and
         line 54, before "using" insert --(--.

Signed and Sealed this

Fourth Day of January, 1994

Attest:

BRUCE LEHMAN

*Attesting Officer*     *Commissioner of Patents and Trademarks*